United States Patent [19]

Sawase et al.

[11] Patent Number: 5,150,016

[45] Date of Patent: Sep. 22, 1992

[54] LED LIGHT SOURCE WITH EASILY ADJUSTABLE LUMINOUS ENERGY

[75] Inventors: Kensuke Sawase; Hiromi Ogata, both of Kyoto, Japan

[73] Assignee: Rohm Co., Ltd., Kyoto, Japan

[21] Appl. No.: 763,289

[22] Filed: Sep. 20, 1991

[30] Foreign Application Priority Data

| Sep. 21, 1990 [JP] | Japan | 2-253405 |
| Sep. 21, 1990 [JP] | Japan | 2-253406 |
| Dec. 26, 1990 [JP] | Japan | 2-406620 |

[51] Int. Cl.$^5$ ............................ H05B 37/00
[52] U.S. Cl. .......................... 315/294; 315/185 R; 315/189; 315/192; 362/800
[58] Field of Search ............... 315/294, 291, 179, 180, 315/185, 189, 192, 312, 58; 362/800, 295; 307/202.1

[56] References Cited

U.S. PATENT DOCUMENTS

| 4,231,079 | 10/1980 | Heminover | 362/800 X |
| 4,329,625 | 5/1982 | Nishizawa et al. | 315/192 X |
| 4,412,241 | 10/1983 | Nelson | 307/202.1 |
| 4,686,384 | 8/1987 | Harvey et al. | 307/202.1 |
| 4,810,937 | 3/1989 | Havel | 315/158 X |
| 4,939,426 | 7/1990 | Menard et al. | 315/192 |
| 4,947,291 | 8/1990 | McDermott | 362/800 X |
| 5,058,059 | 10/1991 | Matsuo et al. | 307/202.1 |

FOREIGN PATENT DOCUMENTS

| 0050117 | 4/1980 | Japan | 315/192 |

*Primary Examiner*—Eugene R. LaRoche
*Assistant Examiner*—Son Dinh
*Attorney, Agent, or Firm*—Fish & Richardson

[57] ABSTRACT

An LED light source with readily adjustable luminous energy including LED chips is disclosed. A resistor device is provided in order to control the current flowing in LED chips for reducing variance of luminous energy. The resistor device includes a plurality of resistors arranged in parallel, and a plurality of fuses connected in series with the respective resistors. In order to obtain the desired resistance value of the resistor device, the fuses connected to unnecessary resistors in series are burnt out by applying an excess current to the fuses thereby omitting a bonding process of the resistors or the like.

5 Claims, 8 Drawing Sheets

LED LIGHT SOURCE WITH EASILY ADJUSTABLE LUMINOUS ENERGY

BACKGROUND OF THE INVENTION (i) Field of the Invention

The present invention relates to an LED (light-emitting diode) light source, and more particularly to a readily luminous energy adjustable LED light source for use in an image sensor such as a facsimile, and for use in a LED head such as printer or the like.

ii) Description of the Related Arts

Conventionally, in an image sensor for reading manuscript information such as a facsimile or the like, a plurality of LEDs are used as a light source. Usually, when the LEDs are used as a light source, each LED chip includes a plurality of LEDs connected in series and a plurality of LED chip rows are aligned in parallel to form a line of light source. However, the LEDs vary in the light output due to variance of epitaxial growth when producing the LEDs, and an important consideration is how to keep the luminous energy of each LED chip group uniform.

Conventionally, as shown in FIG. 1, each LED chip row 1 including a plurality of, for example, four LED chips D1 to D4 connected in series is coupled with a current control resistor 2 in series between an anode A and a cathode K, and the LED chips are driven by a constant voltage to keep the luminous energy uniform.

Usually, the resistance of the current control resistor 2 is determined as follows. That is, a wiring pattern is formed on an insulating substrate, and die bonding of an LED chip row 1 is carried out. Then, wire bonding of the LED chip row 1 and the wiring pattern is performed to obtain a series connection of the LED chip row 1. A probe is applied to the LED chip row 1, and a current is applied to the LED chip row 1 in order to emit light. The resistance value of the current control resistor 2 is determined so that the luminous energy of the LED chip row 1 may be optimum. Hence, a chip resistor having the closest resistance value to the optimum resistance is selected and is mounted on to the substrate as the current control resistor 2 in series with the LED chip row 1. However, since the number of different resistance values of the current control resistor 2 is limited, it is difficult to carry out an accurate adjustment of the luminous energy of the LED chip row 1.

In order to overcome this problem, another current control resistance value determination method has been proposed as shown in FIG. 2. In this case, a silicon chip resistor array 3 having a plurality of, for instance, six resistors R1 to R6 with different resistance values, connected in parallel, is coupled in series with the LED chip row in place of the current control resistor 2 shown in FIG. 1. One or more than one of the six resistors R1 to R6 can be selectively bonded so as to obtain the closest resistance value to the optimum resistance, as disclosed in Japanese Utility Model Application No. Hei 1-87590. In this instance, by connecting the silicon chip resistor array 3 in series with the LED chip row 1, the luminous energy of the LED chip row 1 can be quite accurately controlled. However, the luminous energy measurement process, the resistor selection process and resistor bonding process are required, and it takes a long time to carry out the luminous energy measurement process.

SUMMARY OF THE INVENTION

It is therefore an object of the present invention to provide an LED light source in view of the problems of the prior art, which is capable of carrying out fine control of the luminous energy of the LED chips in a simple and easy process.

In accordance with one aspect of the present invention, there is provided an LED light source including a plurality of LED chips, comprising positive and negative electrodes; at least one LED chip row including a plurality of LED chips connected in series, one end of the LED chip row being connected to one of the electrodes; and a resistor array connected to the LED chip row in series between the two electrodes, the resistor array including a plurality of resistors having different resistance values, arranged in parallel, a plurality of fuses connected in series with the respective resistors, and a plurality of trim pads connected in series with the respective resistors, in parallel with the respective fuses.

In a preferred LED light source, a plurality of LED chip rows are arranged in parallel, and each LED chip row is connected in series with the resistor.

In accordance with another aspect of the present invention, there is provided an LED light source, comprising a plurality of LED chip rows arranged in parallel, each LED chip row including a plurality of LED chips connected in series; a plurality of first control resistor means connected to respective LED chip rows in series for controlling the luminous energy of the LED chip rows; and a second control resistor means connected in common to all of the first control resistors for controlling the luminous energy of the whole LED light source.

The first or second control resistor means includes a plurality of resistors having different resistance values, arranged in parallel, a plurality of fuses connected in series with the respective resistors, and a plurality of trim pads connected in series with the respective resistors, in parallel with the respective fuses.

During the luminous energy control operation, the fuses connected in series with unnecessary resistors are burnt out by applying a current to release the same and to obtain an optimum resistance value so as to omit a wire bonding process for the resistors.

In accordance with a further aspect of the present invention, there is provided an LED light source, comprising a plurality of LEd chips arranged in parallel; an LED drive control circuit including a shift register having a bit memory cells; a latch circuit for latching outputs of the bit memory cells of the shift register; an AND circuit for outputting latch signals of the latch circuit in synchronization with a reference signal; a logic circuit for outputting switching signals on the basis of outputs of the AND circuit; and a plurality of driver FETs for driving the respective LED chips and supplying power to the respective LED chips on the basis of outputs of the logic circuit; a first gate voltage control resistor means connected between a gate terminal for supplying a gate voltage to gates of the driver FETs and a power supply terminal; a plurality of second gate voltage control resistor means having first and second ends, the first ends being connected in common to the gate terminal, the second ends being connected to a plurality of external terminals, respectively; and a plurality of trim fuses having first and second ends, the first ends being connected to the respective external terminals, the second end being connected in common to ground.

BRIEF DESCRIPTION OF THE DRAWINGS

The above and other objects, features and advantages of the present invention will more fully appear from the following description of the preferred embodiments with reference to the accompanying drawings, in which.

DESCRIPTION OF THE PREFERRED EMBODIMENTS

The present invention will now be described in detail with reference to the accompanying drawings.

Figure 1:
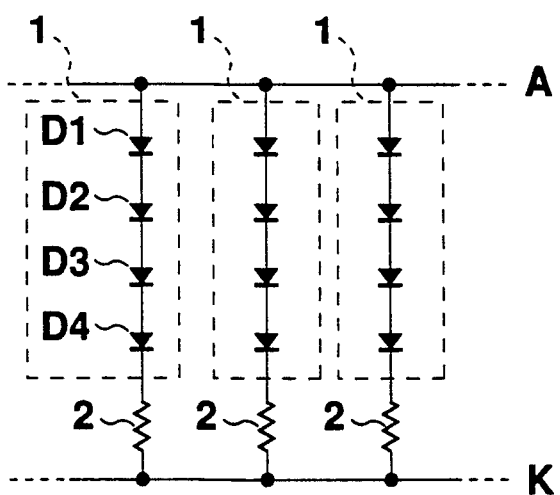
FIG. 1 is a schematic view of a conventional LED light source.
Figure 2:
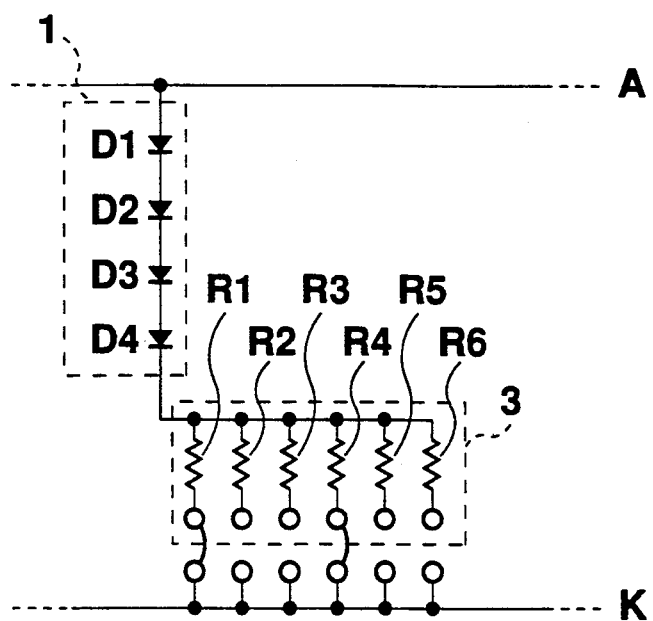
FIG. 2 is a schematic view of another conventional LED light source.
Figure 3:
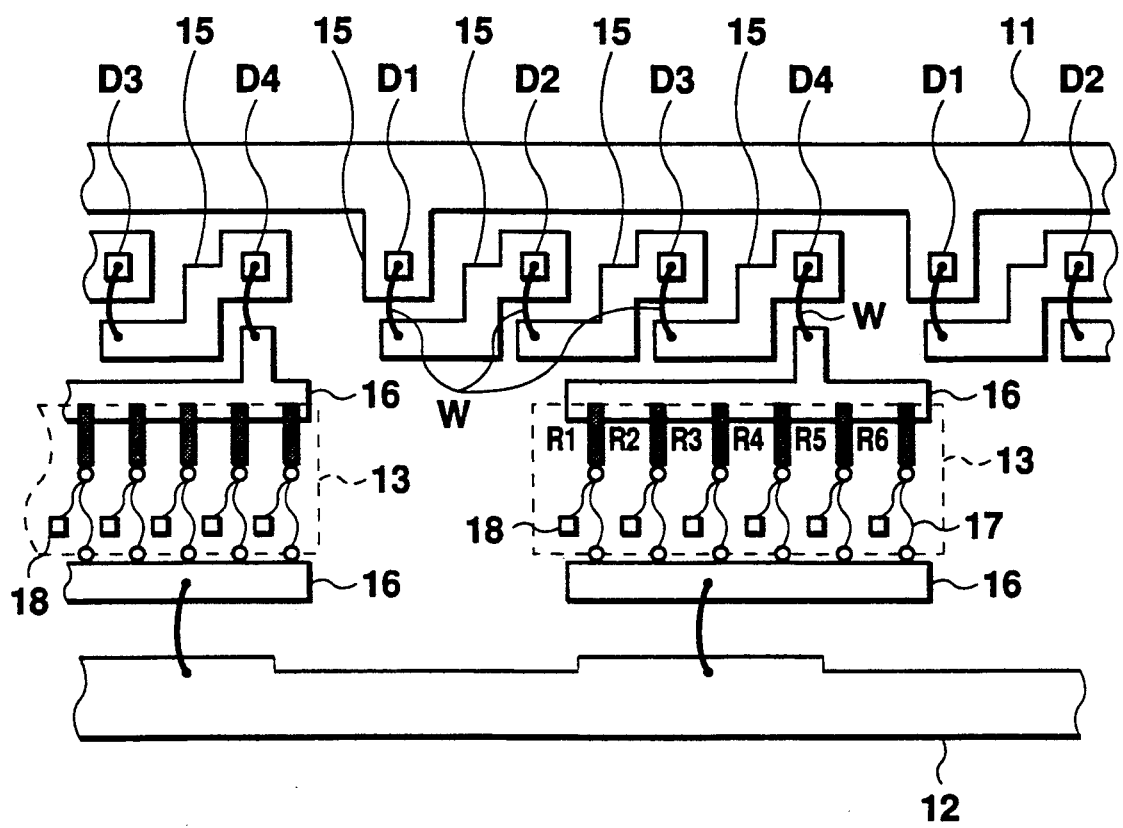
FIG. 3 is a fragmentary elevational view of a wiring pattern of a printed circuit board for an LED light source according to the present invention.

In FIG. 3, there is shown part of a printed circuit board wiring pattern for one embodiment of an LED (light-emitting diode) light source according to the present invention. This printed circuit board has a belt form, and glass epoxy which is inexpensive and has excellent workability is used as the printed circuit board material. Ceramics and glass can also be used for making the printed circuit board.

The wiring pattern formed on the printed circuit board comprises an anode electrode 11, a cathode electrode 12, patterns 15 for the LEDs, patterns 16 for wire bondings and resistor arrays 13. Each resistor array 13 includes a plurality of resistors such as R1 to R6 aligned in parallel and a plurality of fuses 17 connected in series with the respective resistors R1 to R6, and the resistance values of the resistors R1 to R6 are gradually changed in order. A plurality of trim pads 18 are formed in parallel with the fuses 17 and are also connected in series with the respective resistors R1 to R6. The LED patterns 15, the wire bonding patterns 16 and the resistor array 13 are provided for each block, and a part of the LED patterns 15 is integrally formed with the anode electrode 11. LED chips D1, D2, D3 and D4 are formed on the LED patterns 15 by die bonding.

On the other hand, the resistors R1 to R6 of the resistor array 13 are formed on a silicon chip by doping an impurity, and the gradually changed different resistance values of the resistors R1 to R6 are obtained by adjusting the concentration of the impurity. The resistors R1 to R6 are connected to the wire bonding patterns 16.

The LED chips D1, D2, D3 and D4 and the resistor array 13 are connected in series by bonding the LED chips D1, D2, D3 and D4 to the LED patterns 15 and the wiring bonding pattern 16 by using wires W.

Next, a current control resistor R is determined as follows. That is, a probe (not shown) is applied to the LED chips D1 to D4, and the LED chips D1 to D4 are actually forced to emit light so that the light output can be measured. The resistance value of the current control resistor R is determined so that the light output may be optimum, and then one or more than one of the resistors R1 to R6 of the resistor array 13 are selected so that a composite resistor having the closest resistance value to the optimum resistance value may be obtained. As to the not selected resistors, an excess current is flowed between the trim pads 18 of these resistors and the cathode 12 in order to burn out the fuses 17 connected in series with the resistors, thereby releasing the circuits. In this case, since there are a number of combinations of the resistors R1 to R6, a fine and exact resistance value control can be carried out.

In this embodiment, as described above, in the luminous energy control operation, not only the selection of the resistors but also the electrical connection of only the selected resistors can be carried out, and a wiring bonding process can be omitted.

After the determination of the current control resistor R, the LED chips D1 to D4, the resistors R1 to R6 and the fuses 17 are covered with a resin, and a cover is attached to the printed circuit board to obtain an LED light source according to the present invention. By using the obtained LED light source, the desired luminous energy is emitted from the LED chips D1 to D4 onto a manuscript surface and the reading of a manuscript can be conducted.

Figure 4A:
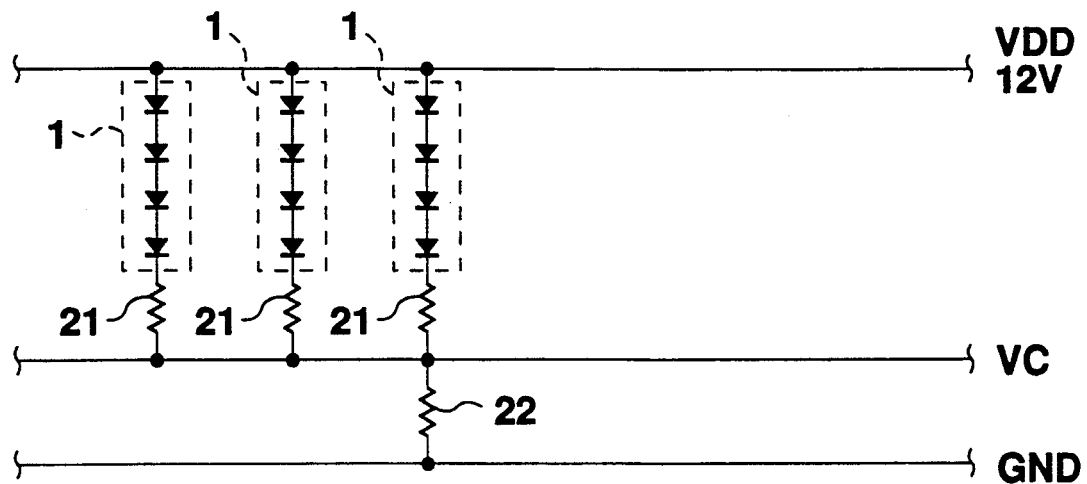
FIGS. 4A and 4B are schematic view of other embodiments of an LED light source according to the present invention.

In FIG. 4A, there is shown another embodiment of an LED light source according to the present invention. In this embodiment, a plurality of LED chip rows 1 can be arranged between a power supply line $V_{DD}$ and a common line $V_C$. Each LED chip row 1 including a plurality of, for example, four LED chips connected in series is coupled with a current control resistor 21 in series between the power supply line $V_{DD}$ and the common line $V_C$. A common resistor 22 is linked between the common line $V_C$ and ground GND.

Figure 5:
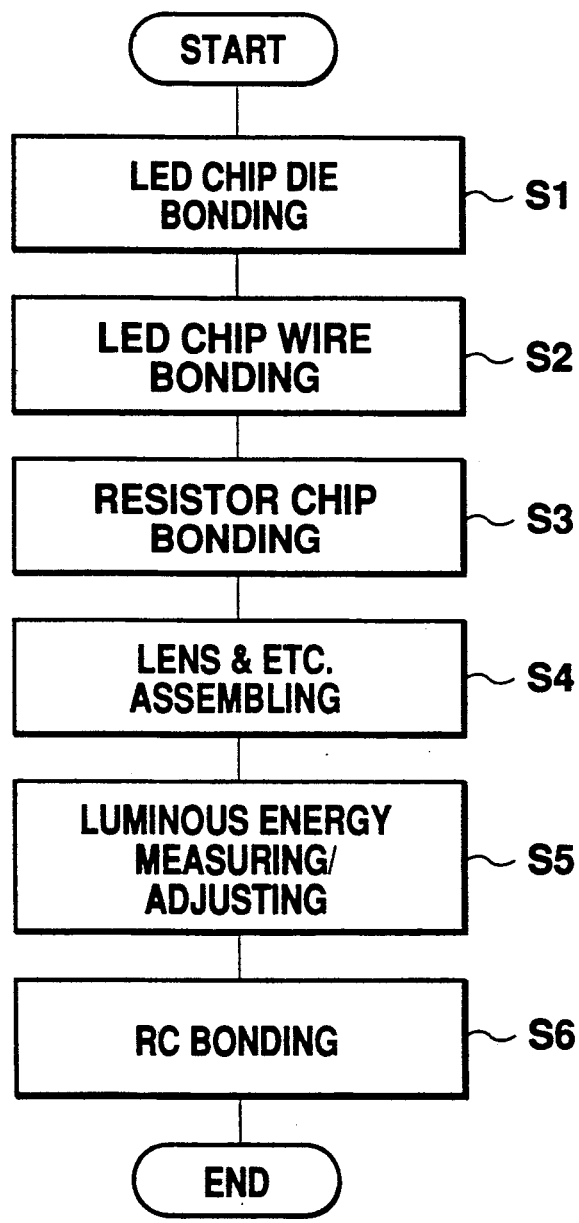
FIG. 5 is a flow sheet for manufacturing an LED light source shown in FIG. 4A.

FIG. 5 shows a process for producing the LED light source shown in FIG. 4A. Die bonding of a plurality of LED chips formed from the same wafer on a substrate is carried out in step S1, and wire bonding of the LED chips to a wiring pattern formed on the substrate is performed for connecting the LED chips in series to obtain the LED chip rows 1 in step S2. Then, each LED chip row 1 and the current control resistor 21 having a certain fixed resistance value are connected in series between the power supply line $V_{DD}$ and the common line $V_C$ in step S3. Next, after the LED chips are protected by covering with a resin, a plastic lens and so forth are assembled on the circuit board in step S4.

In this embodiment, as described above, firstly, the current control resistor 21 is connected in series with each LED chip row 1 so that the current applied to each LED chip row 1 may be almost constant. In the case where the LED chips are formed from the same silicon wafer, the luminous energy variance of the LED chips with reference to the same current value is quite small, and hence there is almost no luminous energy difference among the LED chip rows.

After the luminous energies of each of the LED chip rows 1 are made uniform by coupling the current control resistor 21 with each LED chip row 1 in series, the common resistor 22 is connected between the common line $V_C$ and the ground GND in series with the current control resistors 21 in order to determine the luminous energy of the entire LED light source to a target value. The calculation of the resistance value of the common resistor 22 is conducted in a luminous energy measuring and adjusting step S5 in FIG. 5, and the details of this calculation will be described in connection with FIG. 6.

Figure 6:
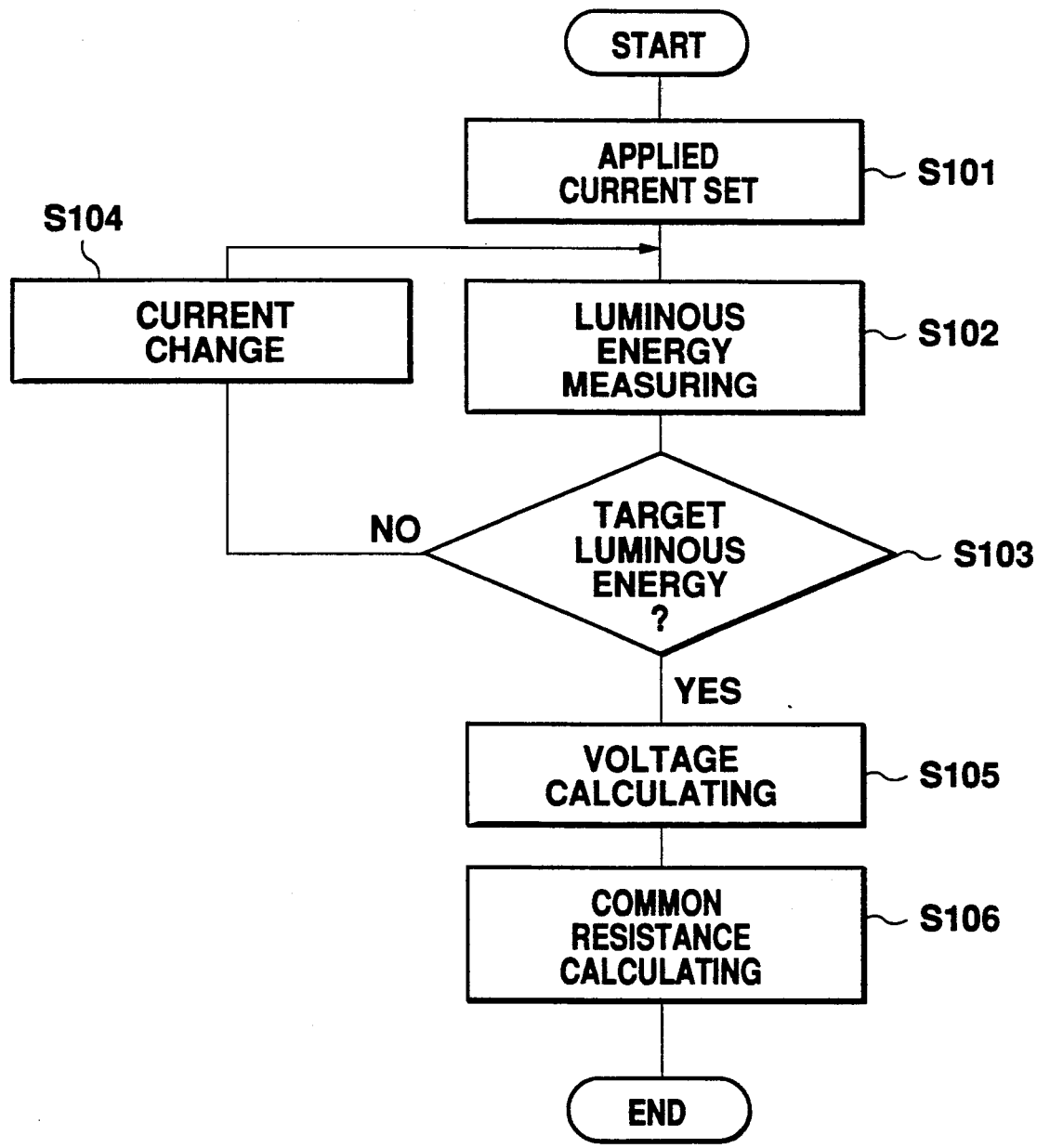
FIG. 6 is a flow sheet for calculating a resistance value of a common resistor shown in FIG. 4A.

As shown in FIG. 6, the current to be applied to the LED chip rows 1 is set in step S101, and the luminous energy emitted from the LED chip rows through the plastic lens is measured in step S102. It is discriminated whether or not the measured luminous energy is equal to the target luminous energy in step S103. When the measured luminous energy is not equal to the target luminous energy in step S103, the applied current is changed in step S104, and measurement of the luminous energy is carried out again in step S102.

When the measured luminous energy is equal to the target luminous energy in step S103, the voltage between the power supply line $V_{DD}$ and the common line $V_C$ is calculated in step S105. At this time, assuming that the voltage between the power supply line $V_{DD}$ and the common line $V_C$ and the voltage of the power supply $V_{DD}$ (usually 12 V in a light source of an image sensor such as a facsimile) are defined to V1 and V, respectively, the resistance value R of the common resistor 22 is calculated by a formula $R=(V-V1)/I$ wherein I is the applied current settled in step S101 or S104, is step S106.

In FIG. 5, the common resistor 22 having the calculated resistance value R is connected between the common line $V_C$ and ground GND in step S6.

Although the current control resistor 21 and the common resistor 22 are formed of single resistor chips in the embodiment shown in FIG. 4A, these resistor 21 and 22 can be replaced with resistor arrays having a similar structure to the resistor array 13 shown in FIG. 3.

Figure 4B:
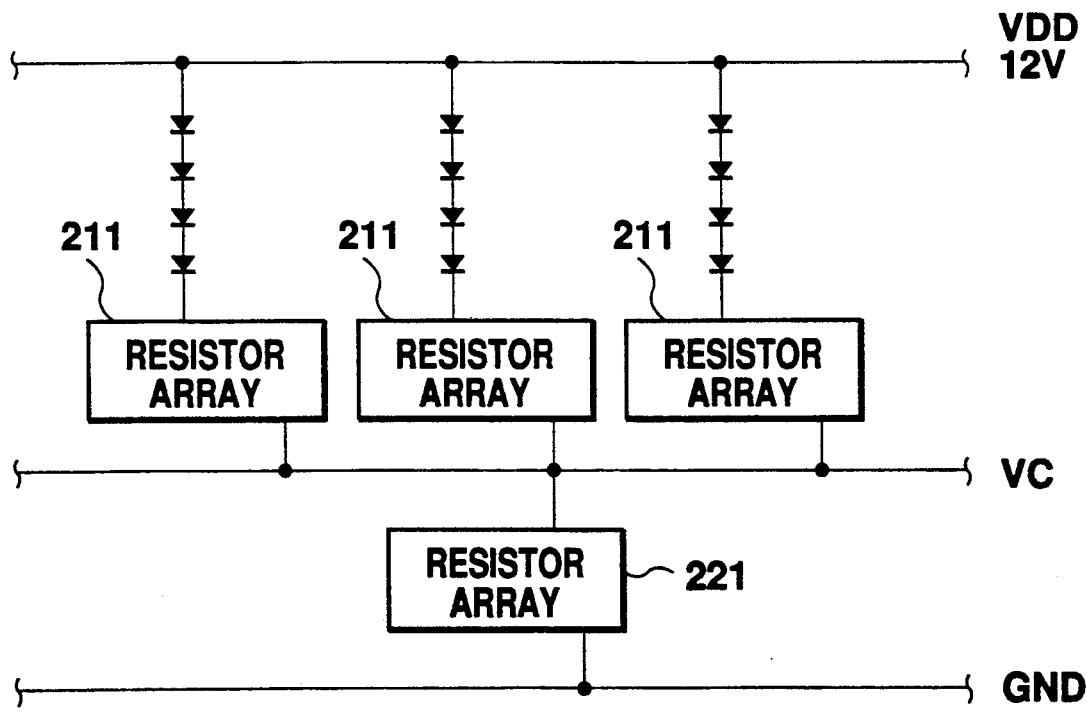

In FIG. 4B, there is shown a further embodiment of an LED light source according to the present invention, having the same construction as that shown in FIG. 4A, except for current control resistor arrays 211 and a common resistor array 221 in place of the resistors 21 and 22. In this embodiment, the determination of the resistor arrays 211 and 221 can be carried out in the same manner as described above in connection with FIG. 3.

In the second and third embodiments, the luminous energy variance among the LED chip rows is removed by the current control resistors or resistor arrays 21 or 211 and the whole luminous energy is controlled by the common resistor or resistor array 22 or 221. Hence, the required target luminous energy can be readily obtained, and the LED light source can be manufactured in a simplified process at a low cost.

Figure 7:
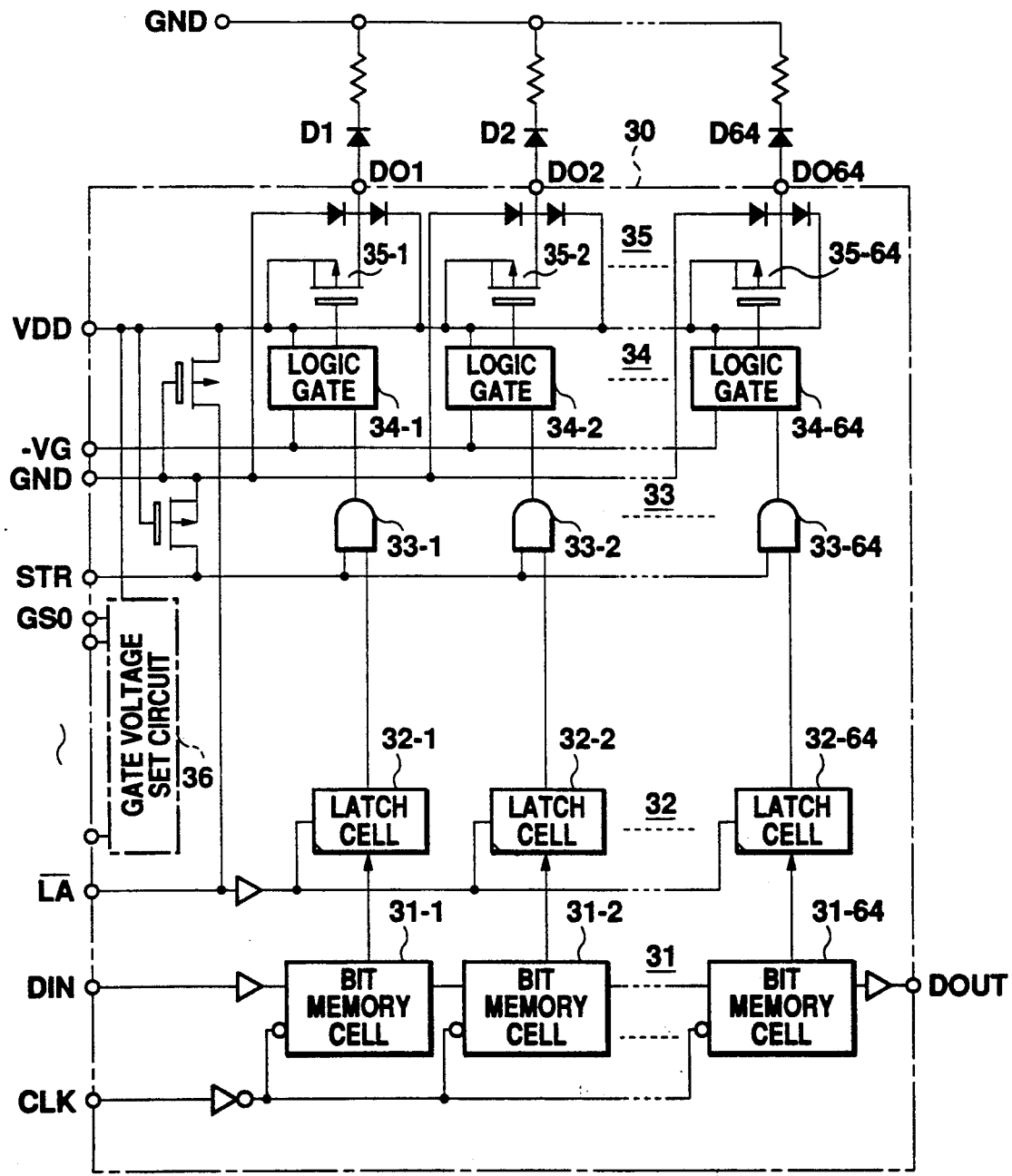
FIG. 7 is a schematic circuit diagram of another embodiment of an LED light source according to the present invention.

In FIG. 7, there is shown another embodiment of an LED light source according to the present invention. In this embodiment, the on-off control of LED chips D1, D2, ..., D64 is carried out by an LED drive control circuit 30, and the LED drive control circuit 30 includes a shift register 31, a latch circuit 32, an AND circuit 33, a logic circuit 34, a driver circuit 35 and a gate voltage set circuit 36. The shift register 31 for storing data input from a DIN terminal in sychronization with a clock signal supplied to a CLK terminal includes bit memory cells 31-1, 31-2, ..., 31-64. The latch circuit 32 for latching the output of the bit memory cells in the shift resister 31 includes latch cells 32-1, 32-2, ..., 32-64. The AND circuit 33 for outputting the latch signals of the latch circuit 32 in sychronization with a strobe signal supplied to an SRT terminal includes AND gates 33-1, 33-2, ..., 33-64. The logic circuit 34 for outputting a gate voltage on a VG terminal when the outputs of the AND gates 33-1, 33-2, ..., 33-64 of the AND circuit 33 are "1" (high level), includes logic gates 34-1, 34-2, ..., 34-64. The driver circuit 35 for switching on the LED chips D1, D2, ..., D64 in response to the outputs of the logic gates 34-1, 34-2, ..., 34-64 of the logic circuit 34, includes driver MOSFETs 35-1, 35-2, ..., 35-64. The gate voltage set circuit 36 controls the gate voltage to be applied to the gates of the driver MOSFETs 35-1, 35-2, ..., 35-64. The LED chips D1, D2, ..., D64 of a luminous element print head are connected to output terminals DO1, DO2, ..., DO64 of the driver MOSFETs 35-1, 35-2, ..., 35-64 of the driver circuit 35.

The operation of the LED light source shown in FIG. 7 will now be described in detail.

When the data for determining whether or not the LED chips are to be lit are input to a DIN terminal, they are stored in the bit memory cells 31-1, 31-2, ..., 31-64 of the shift register 31. For example, when the LED chip is lighted, the data "1" (high level) is stored in the bit memory cell, and, when the LED chip is not lighted, the data "0" (low level) is stored in the same. When a latch signal is input to an LA terminal, the outputs of the bit memory cells 31-1, 31-2, ..., 31-64 of the shift register 31 are latched to the latch cells 32-1, 32-2, ..., 32-64 of the latch circuit 32. The data in the latch cells 32-1, 32-2, ..., 32-64 of the latch circuit 32 are input to the logic gates 34-1, 34-2, ..., 34-64 of the logic circuit 34 through the AND gates 33-1, 33-2, ..., 33-64 of the AND circuit 33 in synchronization with the input of the strobe signal to the STR terminal. The logic gates 34-1, 34-2, ..., 34-64 of the logic circuit 34 output the voltage supplied to the VG terminal only when the data "1" is input from the AND gates 33-1, 33-2, ..., 33-64 of the AND circuit 33.

When the data "0" is input, the logic gates 34-1, 34-2, ..., 34-64 of the logic circuit 34 output a power voltage $V_{DD}$. The gate voltage is input from the logic gates 34-1, 34-2, ..., 34-64 of the logic circuit 34 to the gate of the driver MOSFETs 35-1, 35-2, ..., 35-64 of the driver circuit 35, but, since the voltage VG is input to the logic gates 34-1, 34-2, ..., 34-64, the gate voltage of the driver MOSFETs 35-1, 35-2, ..., 35-64 of the driver circuit 35 become voltage VG. Hence, only the driver MOSFETs receiving the voltage VG are switched on, and the drive signal is flowed from the output terminals DO1, DO2, ..., DO64 of the MOSFETs 35-1, 35-2, ..., 35-64 switched on by the power voltage $V_{DD}$ to the LED chips D1, D2, ..., D64 via the anodes thereof. Thus, the LED chips receiving the drive signal emit light to carry out a printing operation.

In this case, the drive signal flowing in the LED chips D1, D2, ..., D64 through the drivers MOSFETs 35-1, 35-2, ..., 35-64 of the driver circuit 35 can be controlled by the gate voltage on the VG terminal. By using this, in order to make the average luminous energy of the luminous element array head uniform, the gate voltage input to the VG terminal is controlled and set in the gate voltage set circuit 36. The addition of the gate voltage set circuit 36 in the LED drive control circuit 30 is the distinctive feature of this embodiment.

Figure 8:
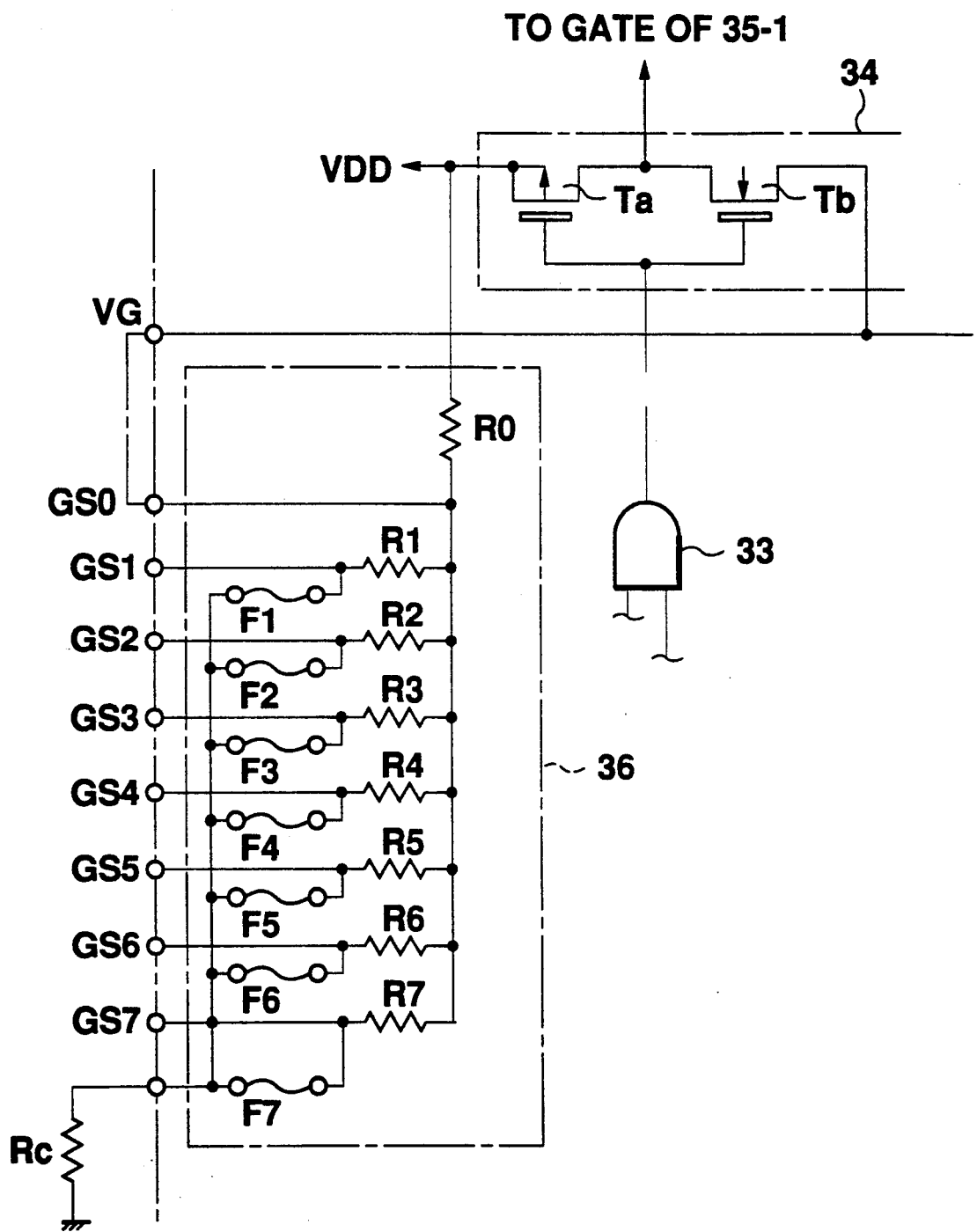
FIG. 8 is a schematic circuit diagram of a gate voltage set circuit shown in FIG. 7.

In FIG. 8, there is shown the gate voltage set circuit 36 shown in FIG. 7. The gate voltage set circuit 36 includes a first gate voltage control resistor R0 whose one end is connected to the power voltage $V_{DD}$, seven second gate voltage control resistors R1 to R7 which each have one end commonly connected to the other end of the first gate voltage control resistor R0, and seven trim fuses F1 to F7 which each have one end linked to the other ends of the respective seven second gate voltage control resistors R1 to R7 and the other ends are commonly connected to ground GND through a load Rc. The other ends of the seven second gate voltage control resistors R1 to R7 are coupled to respective external terminals GS1 to GS7. The other end of the first gate voltage control resistor R0 is connected to an external terminal GSO which is to be coupled to the VG terminal.

In this instance, the resistances of the first and second gate voltage control resistors R0, R1, R2, ..., R7 are set to gradually changed different values. That is, a partial voltage is obtained by passing the power voltage $V_{DD}$ through the series of the first gate voltage control resistors RO, at least one of the second gate voltage control resistors R1 to R7 aligned in parallel and the load Rc, and is applied to the VG terminal. In this case, by properly changing the combinations of the selection of the seven second gate voltage control resistors R1 to R7 connected in parallel, various different resistance values can be obtained, and hence the gate voltage on the VG terminal can be gradually and continuously changed.

In this embodiment, since the seven second gate voltage control resistors R1 to R7 and the seven trim fuses F1 to F7 are coupled in series, respectively, when a necessary gate voltage is sought, while the probe is contacted to an external terminal pad and the luminous energy from the luminous element is measured, the gate voltage is changed. At this time, an excess current is flowed between the external terminals GS1 to GS7 and the load Rc to burn out the trim fuses connected in series with the unnecessary resistors R1 to R7 to release the same. Therefore, in the luminous energy adjusting operation, the necessary resistors can be suitably selected. Hence, a bonding process of the resistors can be omitted, and the desired luminous energy property can be obtained.

In FIG. 8, the operation of the logic gate 34-1 will be described. The logic gate 34-1 comprises a switching MOSFET Ta for supplying the power voltage $V_{DD}$ to the gate of the driver MOSFET 35-1 and a switching MOSFET Tb for supplying the gate voltage VG to the same, and the MOSFETs Ta and Tb are of reversed conductivity types. When the data "1" is input from the AND gate 33-1 to the logic gate 34-1, the MOSFET Tb is switched on, and the voltage on the VG terminal is supplied to the gate of the driver MOSFET 35-1. In turn, when the data "0" is input from the AND gate 33-1 to the logic gate 34-1, the MOSFET Ta is switched on, and the power voltage $V_{DD}$ is output to the gate of the driver MOSFET 35-1.

As described above, in an LED light source according to the present invention, the desired gate voltage can be obtained during the luminous energy adjustment of each luminous element, and hence a bonding process of the resistors or the like can be omitted after the luminous energy adjustment. Thus, a reduction in the number of steps in the manufacturing process and simplification of installation is made possible.

Although the present invention has been described in its preferred embodiments with reference to the accompanying drawings, it is readily understood that the present invention is not restricted to the preferred embodiments and that various changes and modifications can be made by those skilled in the art without departing from the spirit and scope of the present invention.

What is claimed is:

1. An LED light source including a plurality of LED chips, comprising:
   positive and negative electrodes;
   at least one LED chip row including a plurality of LED chips connected in series, one end of the LED chip row being connected to one of the electrodes; and
   a resistor array connected to the LED chip row in series between the two electrodes, the resistor array including a plurality of resistors having different resistance values, arranged in parallel, a plurality of fuses connected in series with the respective resistors, and a plurality of trim pads connected in series with the respective resistors in parallel with the respective fuses.

2. The LED light source of claim 1, wherein a plurality of LED chip rows are arranged in parallel, each LED chip row being connected in series with a resistor.

3. An LED light source, comprising:
   a plurality of LED chip rows arranged in parallel, each LED chip row including a plurality of LED chips connected in a series;
   a plurality of first control resistor means connected to respective LED chip rows in series for controlling the luminous energy of the LED chip rows; and
   a second control resistor means connected in common to the first control resistors for controlling the luminous energy of the entire LED light source.

4. The LED light source of claim 3, wherein each first control resistor means includes a plurality of resistors having different resistance values, arranged in parallel, a plurality of fuses connected to the respective resistors in series, and a plurality of trim pads connected in series with the respective resistors in parallel with the respective fuses, and the second control resistor means includes a plurality of resistors having different resistance values, arranged in parallel, a plurality of fuses connected in series with the respective resistors, and a plurality of trim pads connected in series with the respective resistors, in parallel with the respective fuses.

5. An LED light source, comprising:
   a plurality of LED chips arranged in parallel;
   an LED drive control circuit including:
   a shift register having bit memory cells;
   a latch circuit for latching outputs of the bit memory cells of the shift register;
   an AND circuit for outputting latch signals of the latch circuit in synchronization with a reference signal;
   a logic circuit for outputting switching signals on the basis of outputs of the AND circuit; and
   a plurality of driver FETs for driving the respective LEd chips and supplying power to the respective LED chips on the basis of outputs of the logic circuit;
   a first gate voltage control resistor means connected between a gate terminal for supplying a gate voltage to gates of the driver FETs and a power supply terminal;
   a plurality of second gate voltage control resistor means having first and second ends, the first ends being connected in common to the gate terminal, the second ends being connected to a plurality of external terminals, respectively; and
   a plurality of trim fuses having first and second ends, the first ends being connected to the respective external terminals, the second end being connected in common to ground.

* * * * *